United States Patent
Matsuyama et al.

[11] Patent Number: 6,037,615
[45] Date of Patent: Mar. 14, 2000

[54] METAL SEMICONDUCTOR FET HAVING DOPED AlGAAS LAYER BETWEEN CHANNEL LAYER AND AlGAAS BUFFER LAYER

[75] Inventors: Isamu Matsuyama; Seiji Nishi, both of Toyko, Japan

[73] Assignee: Oki Electric Industry Co., Ltd., Tokyo, Japan

[21] Appl. No.: 09/083,934

[22] Filed: May 26, 1998

[30] Foreign Application Priority Data

Jun. 3, 1997 [JP] Japan .................................. 9-145469

[51] Int. Cl.[7] ................ H01L 31/0328; H01L 31/0336; H01L 31/072
[52] U.S. Cl. .......................... 257/192; 257/194; 257/196
[58] Field of Search .................... 257/192, 194, 257/196

[56] References Cited

U.S. PATENT DOCUMENTS 5,739,558 4/1998 Ishida et al. ............................ 257/192

OTHER PUBLICATIONS

"Oki Denki Research & Development", vol. 64, No. 1, pp. 51–54, Jan. 1997.

Japanese Patent Application Laid–Open No. 53–126282 (1978).

*Primary Examiner*—Steven H. Loke
*Attorney, Agent, or Firm*—Jones Volentine, LLP

[57] ABSTRACT

A metal-semiconductor field effect transistor includes an AlGaAs buffer layer made of $Al_xGa_{1-x}As$, wherein $0<x<0.4$, and a channel layer made of an n-type doped $In_yGa_{1-y}As$, wherein $0<y<0.4$, having a thickness equal to or less than a critical thickness for lattice-matching with GaAs. Further, a doped AlGaAs layer is interposed between the AlGaAs buffer layer and the channel layer. The doped AlGaAs layer is made of $Al_xGa_{1-x}As$, wherein $0<x<0.4$, is doped with Si of a concentration of $5*10^{17}$ cm$^{-3}$ or more, and has a thickness which is sufficient to provide a barrier against holes caused by a donor depletion region.

8 Claims, 5 Drawing Sheets

(a)

(b)

METAL SEMICONDUCTOR FET HAVING DOPED A1GAAS LAYER BETWEEN CHANNEL LAYER AND A1GAAS BUFFER LAYER

BACKGROUND OF THE INVENTION

The present invention relates to a field effect transistor, and more particularly to a metal-semiconductor field effect transistor.

A metal-semiconductor field effect transistor (MESFET) is generally designed such that at least a buffer layer and a channel layer are formed in order on a semi-insulating GaAs substrate through a crystal growth method that enables an epitaxial film to be formed, for example, a solid source molecular beam epitaxy (MBE) method, and a source electrode, a gate electrode and a drain electrode are then formed on these layers to control the movement of carriers (electrons) in the channel layer due to an electric field strength applied through the gate electrode, thereby controlling a current flowing into the drain electrode from the source electrode.

In order to improve the characteristics of the MESFET, there has been known that it is effective to restrain the diffusion of carriers into a lower side (substrate layer side) of the channel layer. To achieve this, there have been proposed a p-layer-buried structure having a buried p-layer ("Oki Denki Research & Development", Vol. 64, No. 1, pp. 51–54, January 1997), a structure having an undoped AlGaAs buffer layer made of a compound the general formula: $Ga_{1-x}Al_xAs$ (Japanese Patent Application Laid-Open No. 53-126282 (1978)), and so on.

In order to study the FET characteristics of an MESFET with a structure having the above undoped AlGaAs buffer layer, the present inventors manufactured the MESFET having the above structure for trial, and investigated the drain current to voltage (ID-VD) characteristics. As a result, the present inventors have observed the hysteresis and kink which are presumed to be caused by impurities such as hole traps existing in the undoped AlGaAs buffer layer, and found such a problem that excellent ID-VD characteristics cannot be obtained.

SUMMARY OF THE INVENTION

An object of the present invention is to obtain an MESFET having an undoped AlGaAs buffer layer that does not suffer from the above problem.

As a result of an intensive study, the present inventors have found that the above problem is solved by the provision of an n-AlGaAs layer on the channel layer side of the undoped AlGaAs buffer layer. Based on this finding, the present invention has been completed.

Thus, the present invention provides a metal-semiconductor field effect transistor (MESFET) having an AlGaAs buffer layer made of $Al_xGa_{1-x}As$ wherein 0<x<0.4, and a channel layer, wherein a doped AlGaAs layer made of $Al_xGa_{1-x}As$ wherein 0<x<0.4, doped with Si of $5 \times 10^{17}$ cm$^{-3}$ or more and having a sufficient thickness for forming a barrier against holes by a donor depletion region is provided on a channel layer side of the AlGaAs buffer layer.

Preferably, the MESFET of the present invention has a channel layer made of an undoped $In_yGa_{1-y}As$ wherein 0<y<0.4, having a critical thickness for lattice-matching with GaAs or less. More preferably, the channel layer is doped to n-type.

In particular, in the MESFET of the present invention, it is preferable that a GaAs buffer layer made of an undoped GaAs, the AlGaAs buffer layer, the doped AlGaAs layer, the channel layer, a low-doped layer made of GaAs doped with Si of $1 \times 10^{17}$ cm$^{-3}$ or more, and a contact layer made of GaAs doped with Si of $1 \times 10^{18}$ cm$^{-3}$ or more are each formed in order on a semi-insulating GaAs substrate as an epitaxial film through a solid source molecular beam epitaxy method.

Also, in the MESFET of the present invention, a spacer layer made of an undoped $Al_xGa_{1-x}As$ wherein 0<x<0.4, may be disposed between the doped layer and the channel layer.

DETAILED DESCRIPTION OF THE INVENTION

Figure 1:
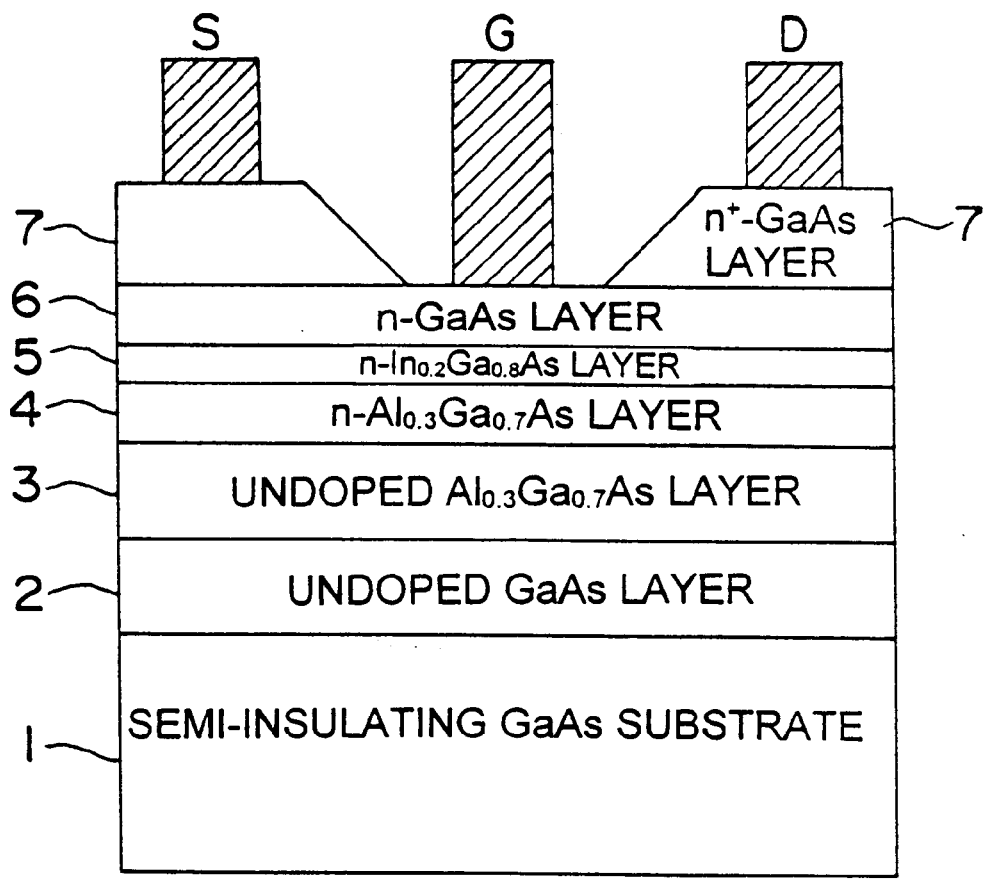
FIG. 1 is a schematic cross-sectional view showing the structure of the MESFET according to Example 1 of the present invention.

The present invention relates to an MESFET having an AlGaAs buffer layer made of $Al_xGa_{1-x}As$ (0<x<0.4) and a channel layer, characterized by providing, on the channel layer side of the AlGaAs buffer layer, a doped AlGaAs layer doped to n-type. With this structure, an ID-VD characteristic excellent in saturation characteristic without any hysteresis and kink can be obtained.

The doped AlGaAs layer is made of $Al_xGa_{1-x}As$ (0<x<0.4, preferably 0.2<x<0.4) doped with Si of $5 \times 10^{17}$ cm$^{-3}$ or more, preferably $1 \times 10^{18}$ to $5 \times 10^{18}$ cm$^{-3}$.

The thickness of the doped AlGaAs layer is sufficient for forming a barrier against holes by a donor depletion region, and usually 50 to 500 Å and preferably 100 to 300 Å although being dependent on the degree of doping.

The channel layer in the MESFET of the present invention may be the same in constitution as that in the conventional MESFET, and preferably a channel layer made of an undoped $In_yGa_{1-y}As$ having a critical thickness for lattice-matching with GaAs or less. Because the channel layer made of $In_yGa_{1-y}As$ is high in the mobility of electrons, a low on-resistance is obtained in the MESFET. It is not preferred that the thickness of the channel layer exceeds the critical thickness because the lattice relaxation occurs.

The critical thickness for lattice-matching with GaAs depends on the composition of $In_yGa_{1-y}As$. For example, in the case where y is 0.2, the critical thickness is 150 Å. The thickness of the channel layer is usually 100 to 200 Å.

Also, it is more preferable that the channel layer is doped to n-type. The degree of doping is usually $5 \times 10^{17}$ to $1 \times 10^{18}$ cm$^{-3}$ of Si.

The semi-insulating substrate in the MESFET of the present invention may be the same as that in the conventional MESFET, and a semi-insulating GaAs substrate, etc., are used.

Also, in the MESFET of the present invention, a buffer layer other than the AlGaAs buffer layer may be disposed between the semi-insulating substrate and the AlGaAs buffer layer, and a contact layer may be disposed between an electrode and the channel layer. The constitutions of the buffer layer and the contact layer may be the same as those in the conventional MESFET. For example, they are a buffer layer of 5000 Å or less in thickness and a contact layer of 500 to 1000 Å in thickness doped with Si of $1\times10^{18}$ to $1\times10^{18}$ cm$^{-3}$. Further, in the MESFET of the present invention, in order to reduce a gate capacitance and improve a withstand voltage between the gate and the drain, a low-doped layer lower than the contact layer in the degree of doping may be disposed between the channel layer and the contact layer. For example, it may be a low-doped layer of 300 to 2000 Å in thickness doped with Si of $1\times10^{17}$ to $1\times10^{18}$ cm$^{-3}$.

Furthermore, in the MESFET of the present invention, a spacer layer made of an undoped $Al_xGa_{1-x}As$ (0<x<0.4) may be disposed between the doped layer and the channel layer. The thickness of the spacer layer is usually 10 to 100 Å.

The MESFET of the present invention can be produced as follows.

First, layers including at least the AlGaAs buffer layer, the doped AlGaAs layer, and the channel layer are formed on a semi-insulating substrate in order as an epitaxial layer through the crystal growth method by which the epitaxial layer can be manufactured, preferably the solid source molecular beam epitaxy (MBE) method. Then, the respective electrodes of the source, the gate and the drain are formed so as to form an ohmic contact junction or Schottky contact junction.

The formation of the epitaxial film through the crystal growth method such as the MBE method, the ohmic contact junction and the Schottky contact junction can be performed through the known method. Also, packaging may be also conducted by the known method.

In particular, in the MESFET of the present invention, it is preferable that a GaAs buffer layer made of an undoped GaAs, the AlGaAs buffer layer, the doped AlGaAs layer, the channel layer, a low-doped layer made of GaAs doped with Si of $1\times10^{17}$ cm$^{-3}$ or more, and a contact layer made of GaAs doped with Si of $1\times10^{18}$ cm$^{-3}$ or more are each formed in order on a semi-insulating GaAs substrate as an epitaxial film through the solid source molecular beam epitaxy method. Also, with reference to the formation of electrodes, it is preferred that the source electrode and the drain electrode are formed on the contact layer so as to form the ohmic contact junction, and finally the gate electrode formation section is etched to an appropriate depth to expose a layer under the contact layer, and the gate electrode is formed so as to form the Schottky contact junction.

The reason that an ID-VD characteristic excellent in saturation characteristic without any hysteresis and kink can be obtained with the provision of the doped AlGaAs layer doped to n-type is presumed as follows.

Figure 5:
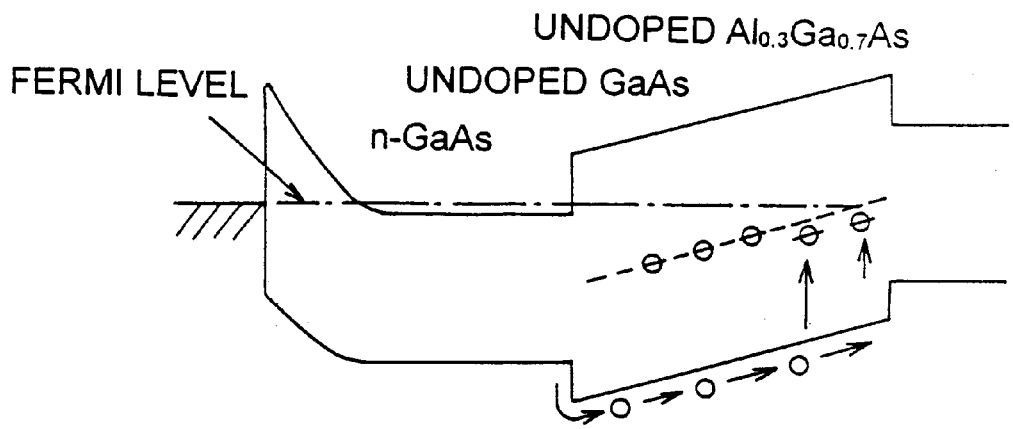
FIG. 5 shows diagrams showing energy bands of electrons that come to a substrate from a gate electrode in the structure of an example of a conventional MESFET (a) and the structure of an example of the MESFET according to the present invention (b).
Figure 5:
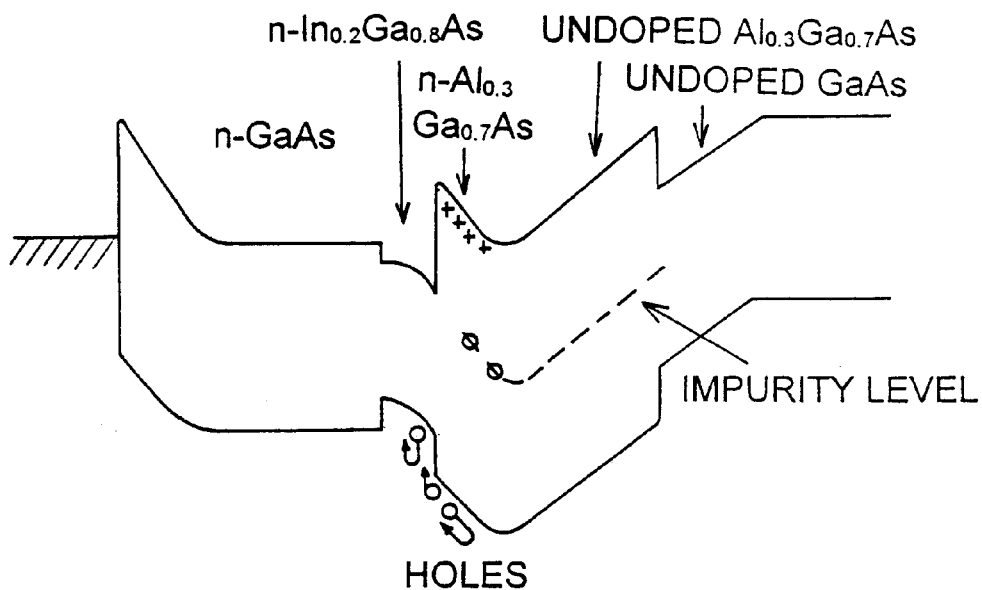

FIGS. 5(a) and (b) show a diagram showing the energy band of electrons that come to a substrate from a gate electrode in the structure of an example of a conventional MESFET having a channel layer made of GaAs doped to n-type, a spacer layer made of undoped GaAs and an AlGaAs buffer layer made of undoped $Al_{0.3}Ga_{0.7}As$, and a diagram showing the energy band of electrons that come to a substrate from a gate electrode in the structure of an example of the MESFET according to the present invention, having a low-doped layer made of GaAs doped to n-type, a channel layer made of $In_{0.2}Ga_{0.8}As$ doped to n-type, a doped AlGaAs layer made of $Al_{0.3}Ga_{0.7}As$ doped to n-type, an AlGaAs buffer layer made of undoped $Al_{0.3}Ga_{0.7}As$, and a buffer layer made of undoped GaAs.

In the conventional structure shown in FIG. 5(a), uniform electric field is applied up to the substrate in the AlGaAs buffer layer, and because holes occurring due to impact ionization, etc., in the channel flow to the substrate side, the holes are trapped to the impurity level existing in the AlGaAs layer. Then, due to the charge/discharge of the holes trapped to the impurity level, hysteresis and kink of ID-VD characteristic occur.

On the other hand, in the structure of the present invention as shown in FIG. 5(b), a barrier is formed against the holes in the doped AlGaAs layer doped to n-type due to the donor depletion region therein. For that reason, the holes generated in the channel do not flow to the substrate side, and there is no possibility that the holes are trapped to the impurity level existing in the AlGaAs buffer layer.

Therefore, the thickness of the doped AlGaAs layer may be one sufficient for forming the barrier against the holes due to the donor depletion region.

To allow a film to grow at a low growth temperature through the MBE method is advantageous from the viewpoint of the manufacturing costs, etc., but since there has been known that the AlGaAs film grown through the MBE method is liable to take the impurities in the growth atmosphere particularly when it grows at the low growth temperature, it is presumed to require specific measurement against impurity. The MESFET of the present invention which does not generate the hysteresis, kink and so on in the ID-VD characteristics which are caused by the impurities in the AlGaAs film can be manufactured under the advantageous conditions without requiring the specific measurement against impurity.

As described above, according to the present invention, there can be obtained the MESFET having the undoped AlGaAs buffer layer with the ID-VD characteristic having no hysteresis and kink.

EXAMPLES

Hereinafter, an example of the present invention will be described, but the present invention is not limited by or to this.

Example 1

On a semi-insulating GaAs substrate 1, a GaAs buffer layer 2 of 1000 Å in thickness made of an undoped GaAs, an AlGaAs buffer layer 3 of 1000 Å in thickness made of undoped $Al_xGa_{1-x}As$ (x=0.3), a doped AlGaAs layer 4 of 300 Å in thickness made of $Al_xGa_{1-x}As$ (x=0.3) doped with Si of $1\times10^{18}$ cm$^{-3}$, a channel layer 5 of 100 Å in thickness made of $In_yGa_{1-y}As$ (y=0.2) with Si of $8\times10^{17}$ cm$^{-3}$, a low-doped layer 6 of 500 Å in thickness made of GaAs doped with Si of $8\times10^{17}$ cm$^{-3}$, and a contact layer 7 of 1000 Å in thickness doped with Si of $3\times10^{18}$ cm$^{-3}$ were each formed in order as an epitaxial film through the MBE method. Then, a source electrode S and a drain electrode D are formed on the contact layer 7 so as to form the ohmic contact junction, and finally the gate electrode formation section is etched to the depth of 1200 Å, and the gate electrode G is formed so as to form the Schottky contact junction. The schematic cross-sectional view of the structure of the MESFET as obtained is shown in FIG. 1.

Figure 2:
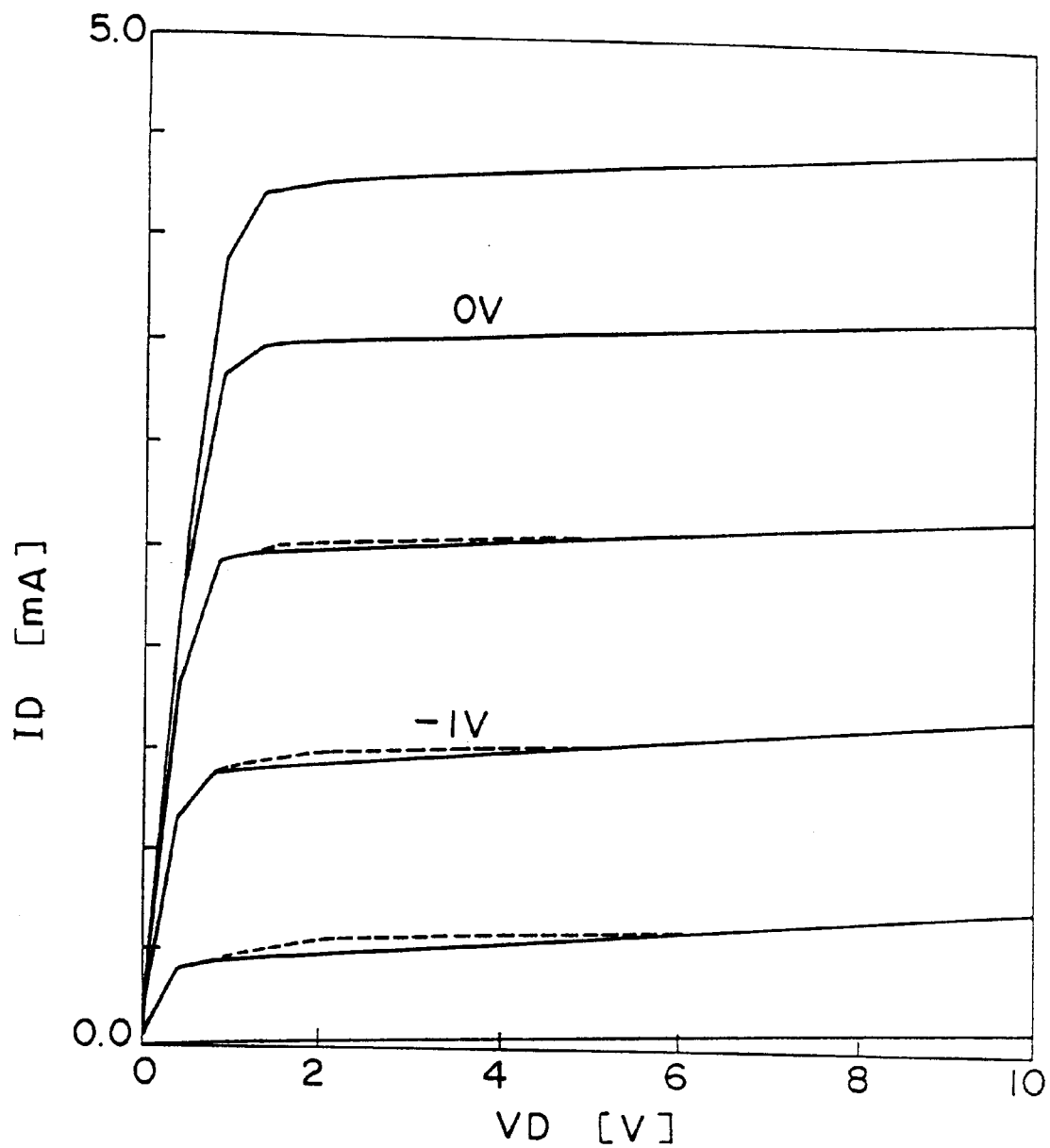
FIG. 2 is a graph showing the ID-VD characteristics of the MESFET according to Example 1 of the present invention.

The ID-VD characteristics of the MESFET as obtained was measured. The result is shown in FIG. 2. The hysteresis and kink of the non-permissible range were not found, and it was confirmed that the excellent saturation characteristics and the small on-resistance are provided.

Comparative Example 1

Figure 3:
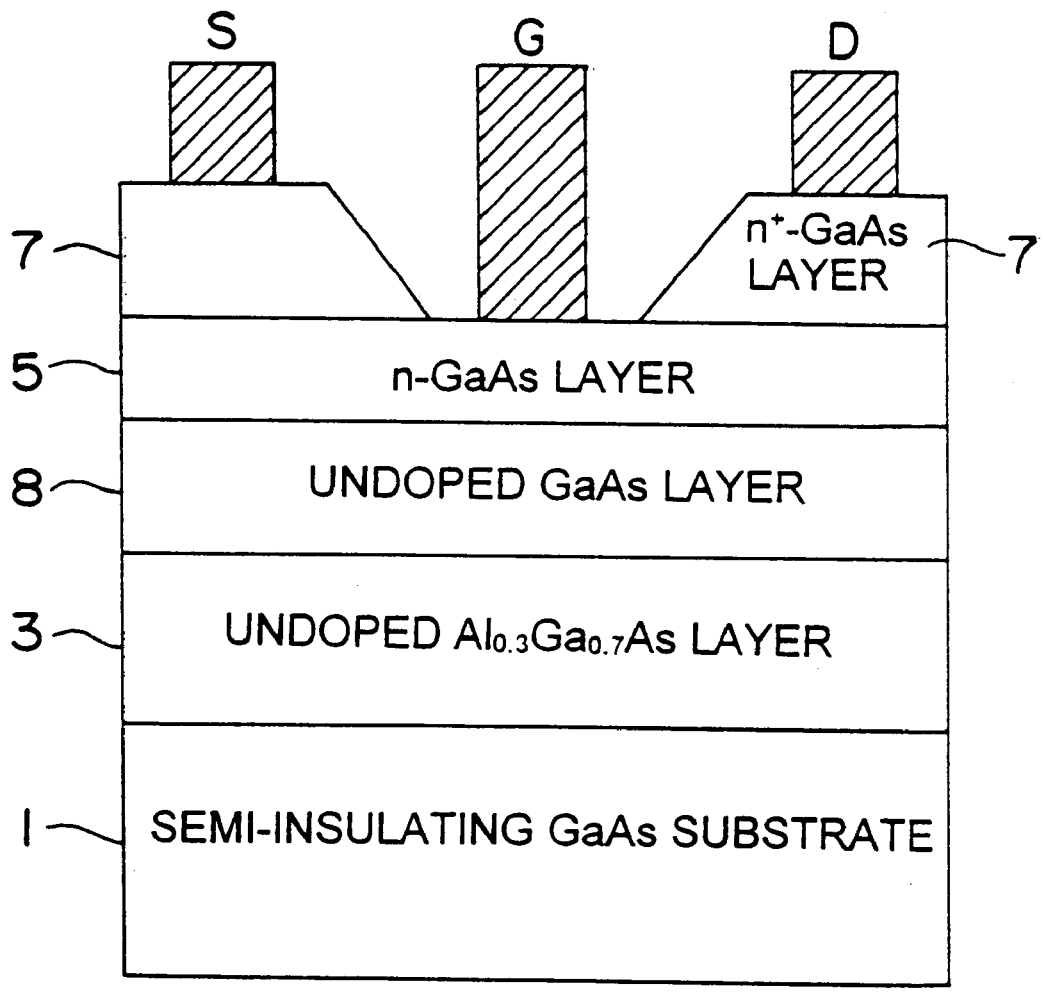
FIG. 3 is a schematic cross-sectional view showing the structure of the MESFET according to Comparative Example 1.

On a semi-insulating GaAs substrate 1, an AlGaAs buffer layer 3 of 7000 Å in thickness made of undoped $Al_xGa_{1-x}As$ (x=0.3), a spacer layer 8 of 300 Å in thickness made of undoped GaAs, a channel layer 5 of 500 Å in thickness made of GaAs with Si of $8 \times 10^{17}$ cm$^{-3}$, and a contact layer 7 of 1000 Å in thickness doped with Si of $3 \times 10^{18}$ cm$^{-3}$ were each formed in order as an epitaxial film through the MBE method. Then, a source electrode S and a drain electrode D are formed on the contact layer 7 so as to form the ohmic contact junction, and finally the gate electrode formation section is etched to the depth of 1200 Å, and the gate electrode G is formed so as to form the Schottky contact junction. The schematic cross-sectional view of the structure of the MESFET as obtained is shown in FIG. 3.

Figure 4:
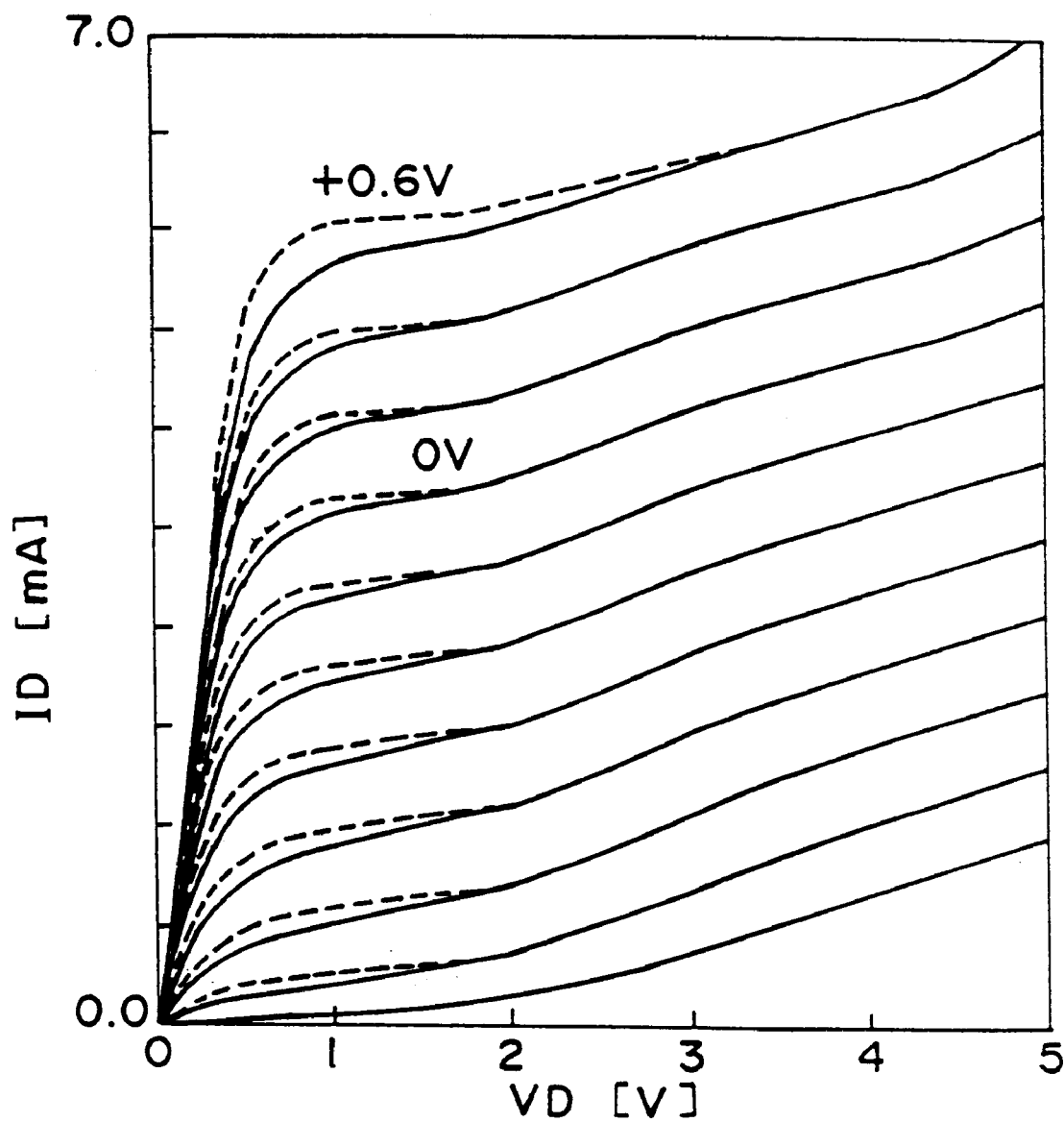
FIG. 4 is a graph showing the ID-VD characteristics of the MESFET according to Comparative Example 1.

The ID-VD characteristics of the MESFET as obtained was measured. The result is shown in FIG. 4. The hysteresis and kink were clearly found. In the drawings, a solid line denotes a graph at the time of rising, and a dotted line is a graph at the time of falling.

What is claimed is:

1. A metal-semiconductor field effect transistor comprising:

an AlGaAs buffer layer made of $Al_xGa_{1-x}As$ wherein 0<x<0.4;

a channel layer made of an n-type doped $In_yGa1-YAs$, wherein 0<y<0.4, having a thickness equal to or less than a critical thickness for lattice-matching with GaAs; and a doped AlGaAs layer interposed between said AlGaAs buffer layer and said channel layer, said doped AlGaAs layer made of $Al_xGa_{1-x}As$, wherein 0<x<0.4, doped with Si of a concentration of $5*10^{17}$ cm$^{-3}$ or more, and having a thickness which is sufficient to provide a barrier against holes caused by a donor depletion region.

2. A metal-semiconductor field effect transistor according to claim 1, further comprising:

a semi-insulating GaAs substrate;

a GaAs buffer layer interposed between said semi-insulating substrate and said AlGaAs buffer layer;

a contact layer made of GaAs and doped with Si of a concentration of $1*10^{18}$ cm$^{-3}$ or more; and a doped layer made of GaAs interposed between said contact layer and said channel layer, said doped layer doped with Si of a concentration of $1*10^{17}$ cm$^{-3}$ or more, and less than the concentration of said contact layer.

3. A metal-semiconductor field effect transistor according to claim 2, wherein said GaAs buffer layer, said AlGaAs buffer layer, said doped AlGaAs layer, said channel layer, said doped layer, and said contact layer are each an epitaxial film formed by a solid source molecular beam epitaxy technique.

4. A metal-semiconductor field effect transistor according to claim 3, wherein said channel layer is doped with Si of a concentration of $5*10^{17}$ cm$^{-3}$ to $1*10^{18}$ cm$^{-3}$.

5. A metal-semiconductor field effect transistor according to claim 2, wherein said channel layer is doped with Si of a concentration of $5*10^{17}$ cm$^{-3}$ to $1*10^{18}$cm$^{-3}$.

6. A metal-semiconductor field effect transistor according to claim 1, further comprising a spacer layer made of undoped $Al_xGa_{1-x}As$, wherein 0<x<0.4, and interposed between said doped AlGaAs layer and said channel layer.

7. A metal-semiconductor field effect transistor according to claim 6, wherein said channel layer is doped with Si of a concentration of $5*10^{17}$ cm$^{-3}$ to $1*10^{18}$ cm$^{-3}$.

8. A metal-semiconductor field effect transistor according to claim 1, wherein said channel layer is doped with Si of a concentration of $5*10^{17}$ cm$^{-3}$ to $1*10^{18}$ cm$^{-3}$.

* * * * *